(12) United States Patent
Calderon Rico et al.

(10) Patent No.: US 11,119,167 B2
(45) Date of Patent: Sep. 14, 2021

(54) SYSTEMS AND METHODS FOR WIRELESS COMMUNICATION IN MAGNETIC RESONANCE IMAGING (MRI)

(71) Applicant: KONINKLIJKE PHILIPS N.V., Eindhoven (NL)

(72) Inventors: Rodrigo Calderon Rico, Newberry, FL (US); Arne Reykowski, Newberry, FL (US); Paul Franz Redder, Newberry, FL (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/760,506

(22) PCT Filed: Oct. 24, 2018

(86) PCT No.: PCT/EP2018/079170
§ 371 (c)(1),
(2) Date: Apr. 30, 2020

(87) PCT Pub. No.: WO2019/086312
PCT Pub. Date: May 9, 2019

(65) Prior Publication Data
US 2020/0256938 A1   Aug. 13, 2020

Related U.S. Application Data

(60) Provisional application No. 62/579,922, filed on Nov. 1, 2017.

(51) Int. Cl.
*G01R 33/36* (2006.01)

(52) U.S. Cl.
CPC .............. *G01R 33/3692* (2013.01)

(58) Field of Classification Search
CPC .................................... G01R 33/3692
See application file for complete search history.

(56) References Cited

U.S. PATENT DOCUMENTS

| | | | | |
|---|---|---|---|---|
| 8,502,540 B2 * | 8/2013 | Nakanishi | .......... | G01R 33/3692 324/322 |
| 8,704,522 B2 * | 4/2014 | Akita | .............. | G01R 33/3692 324/322 |

(Continued)

OTHER PUBLICATIONS

Quitin, Franeois and Rahman, Muhammad and Mudumbai, Raghuraman and Madhow, Upamanyu, "A Scalable Architecture for Distributed Transmit Beamforming with Commodity Radios: Design and Proof of Concept", IEEE Transactions on Wireless Communications, 2013, vol. 12, No. 3, Pag.1418-1428.

(Continued)

*Primary Examiner* — Dixomara Vargas

(57) ABSTRACT

A magnetic resonance imaging system (100, 200, 300, 400) includes a wireless communication station (600) which: receives via a receive antenna element (630) at least one first clock signal among two or more first clock signals which are synchronized with a first clock (510); transmits two or more second clock signals from two or more transmit antenna elements (620-1) of a phased array antenna (620); transmits data representing a sensed magnetic resonance signal from at least two of the transmit antenna elements; outputs a clock synchronization signal in response to the received first clock signal(s); and synchronizes a second clock (610) to the first clock signal in response to the clock synchronization signal. The first clock signals are transmitted by a phased array antenna (520) of another wireless communication station (500). Phase and signal diversity transmission allows the first and second wireless communication stations to maintain clock synchronization in case of a loss of a line of sight path between the stations.

15 Claims, 7 Drawing Sheets

(56) References Cited

U.S. PATENT DOCUMENTS

| | | | |
|---|---|---|---|
| 10,126,391 B2* | 11/2018 | Weissler | G01T 1/2985 |
| 2008/0259897 A1 | 10/2008 | Van Helvoort et al. | |
| 2010/0117649 A1* | 5/2010 | Nakanishi | G01R 33/3692 |
| | | | 324/318 |
| 2011/0227574 A1* | 9/2011 | Akita | G01R 33/3692 |
| | | | 324/322 |
| 2012/0249135 A1 | 10/2012 | Albseier et al. | |
| 2013/0106419 A1 | 5/2013 | Biber | |
| 2016/0069969 A1 | 3/2016 | Tomiha et al. | |
| 2016/0161578 A1* | 6/2016 | Weissler | G01T 1/2985 |
| | | | 324/309 |
| 2016/0192234 A1 | 6/2016 | Hawkes et al. | |
| 2017/0082706 A1 | 3/2017 | Soejima | |
| 2017/0176552 A1 | 6/2017 | Reykowski | |
| 2017/0373541 A1* | 12/2017 | Shimokawa | H02M 1/08 |
| 2018/0226842 A1* | 8/2018 | Uchida | H02J 50/40 |
| 2018/0356478 A1 | 12/2018 | Reykowski | |
| 2018/0376441 A1 | 12/2018 | Reykowski et al. | |

OTHER PUBLICATIONS

Johan Xi Zhang and Elias Parastates, "A novel method in Passive localization: Synthetic Triangulation Beamformer", IEEE, 2011.

David Jenn, Yong Lake, Matthew Tong, Eng Choon Yea, and Robert Broadston, "Distributed Phased Arrays with Wireless Beamforming", IEEE, 2007.

R. Mudumbai, P. Bidigare, S. Pruessing, S. Dasgupta, M. Oyarzun, D. Raeman, "Scalable Feedback Algorithms far Distributed Transmit Beamforming in Wireless Networks", IEEE, 2012.

J. Abisha, G. Indumathi, Dr. K. Murugesan, "Adaptive Array Beamforming under Rayleigh Fading Environment", International Conference on Computing, Electronics and Electrical Tecnologies, 2012.

International Search Report from PCT/EP2018/079170 dated Feb. 20, 2019.

\* cited by examiner

SYSTEMS AND METHODS FOR WIRELESS COMMUNICATION IN MAGNETIC RESONANCE IMAGING (MRI)

CROSS REFERENCE TO RELATED APPLICATIONS

This application is a U.S. national phase application of International Application No. PCT/EP2018/079170 filed on Oct. 24, 2018, which claims the benefit of U.S. Application Ser. No. 62/579,922 filed on Nov. 1, 2017 and is incorporated herein by reference.

TECHNICAL FIELD

The present system generally relates to a magnetic resonance imaging (MRI) system with a wireless-type radio-frequency (RF) coil portion and a method of operation thereof.

BACKGROUND AND SUMMARY

Magnetic Resonance Imaging (MRI) is an imaging method that generally uses frequency and phase encoding of protons for image reconstruction. More recently, MRI systems have begun to use a wireless-type RF coil or coils to sense magnetic resonance signal emitted from a subject under MRI examination. In particular, the wireless RF coils acquire analog MR information during an acquisition period, and then an associated RF station converts the analog MR information to form digitized data, such as digitized raw data (k-space) information. Thereafter, a first wireless communication station (also referred to as a mobile station) wirelessly communicates to a second wireless communication station (also referred to as a base station) which passes the data to a system controller for further processing and/or display on a display of the MRI system.

An example of such a system is disclosed in international patent publication WO/2017103759A2.

Here, the mobile RF station relies upon an internal clock for correct synchronization with a system clock (e.g., a master clock) of the MRI system and base station. The amount of data produced for each scan requires high throughput, and is directly proportional to the number of communication channels which are used. Since the clock is being used by the MRI system to acquire the diagnostic imaging data, phase jitter should be minimized.

However, because of the wireless nature of wireless RF coils and induced RF jitter and phase drift, it is often difficult to accurately maintain synchronization between the internal clock of the mobile communication station, base station and the MRI system clock using conventional wireless communication methods. For example, a Line-Of-Sight (LOS) between the mobile communication station of the MRI system and the base communication station of the MRI system may be blocked due to patient positioning or motion, as a result of which the clock synchronization information could get lost, causing the clock to drift and ultimately losing the clock synchronization.

Unfortunately, when the wireless RF station internal clock is not accurately synchronized with the MRI system clock, phase noise of the wireless RF station internal clock can cause image artifacts in reconstructed images due to the nature of an encoding method being used, particularly during long acquisitions. For example, it can be shown that if it is required that the clock-induced root-mean-square (RMS) phase error in raw image data remain below 1 degree, then the RMS time jitter should be controlled to remain less than 44 picoseconds (ps) at 64 MHz and less than 22 ps at 128 MHz.

Accordingly, it would be desired to provide a system and method of wireless communication for an MRI system. It would further be desired to provide a system and method of wireless communication for an MRI system which facilitates clock recovery and synchronization of an internal clock of a mobile communication station to the master clock of the MRI system which can maintain clock synchronization between the mobile communication station and the base communication station associated with the rest of the MRI system. Furthermore, it would be desirable to provide a system and method for a wireless RF station to synchronize the wireless RF station internal clock to an MRI system clock based on an MRI system transmission received in cases where the line of sight may be blocked and where transmission is via multipath propagation.

In one aspect, the present invention can provide a magnetic resonance imaging (MRI) system, including: a magnet configured to produce a magnetic field; a patient table configured to hold a patient; gradient coils configured to at least partially surround at least a portion of the patient; a radio frequency (RF) coil unit configured to apply an RF signal to at least a portion of a patient which is being imaged, and to alter an alignment of the magnetic field in the portion of the patient; a sensor configured to sense a magnetic resonance signal emitted from the patient in response to the RF signal; a first wireless communication station; and a second wireless communication station separated and spaced apart from the first wireless communication station, and configured to wirelessly transmit to the first wireless communication station data representing the sensed magnetic resonance signal. The first wireless communication station includes: a first clock, a first phased array antenna comprising a plurality of separately-phased first transmit antenna elements separated and spaced apart from each other, wherein two or more of the first transmit antenna elements wirelessly transmit two or more corresponding first clock signals which are synchronized with the first clock, a first receive antenna element configured to wirelessly receive at least one second clock signal among two or more second clock signals which are synchronized with a second clock, a first receiver configured to receive the least one second clock signal from the first receive antenna, and in response thereto to output a first clock synchronization signal, and a first clock synchronization circuit configured to receive the first clock synchronization signal and in response thereto to synchronize the first clock to the at least one second clock signal. The second wireless communication station includes: the second clock; a second phased antenna array comprising a plurality of separately-phased second transmit antenna elements separated and spaced apart from each other, wherein two or more of the second transmit antenna elements wirelessly transmit the two or more second clock signals which are synchronized with the second clock, and at least two of the second transmit antenna elements wirelessly transmit the data representing the sensed magnetic resonance signal, a second receive antenna element configured to wirelessly receive at least one first clock signal among the two or more first clock signals from at least one of the two or more first transmit antenna elements which wirelessly transmit the first clock signals, a second receiver configured to receive the at least one first clock signal from the second receive antenna element and in response thereto to output a second clock synchronization signal, and a second clock synchronization circuit configured to receive the second clock synchronization signal and in response thereto to synchronize the second clock to the at least one first clock signal.

Another aspect of the present invention can provide a method, comprising: producing a magnetic field; applying an RF signal to at least a portion of a patient which is being imaged, and altering an alignment of the magnetic field; sensing a magnetic resonance signal emitted from the patient in response to the RF signal; receiving at a receiver via a receive antenna element at least one first clock signal among two or more first clock signals which are synchronized with a first clock; wirelessly transmitting two or more second clock signals, which are synchronized with a second clock, from two or more corresponding transmit antenna elements of a phased array antenna comprising a plurality of separately-phased transmit antenna elements separated and spaced apart from each other; wirelessly transmitting data representing the sensed magnetic resonance signal from at least two of the transmit antenna elements of the phased array antenna; in response to the at least one first clock signal received at the receiver, outputting a second clock synchronization signal; and synchronizing the second clock to the at least one first clock signal in response to the second clock synchronization signal.

Yet another aspect of the present invention can provide a device, comprising: a sensor configured to sense a magnetic resonance signal emitted from a patient in response to a magnetic field and a radio frequency signal; and a wireless communication station configured to wirelessly transmit data representing the sensed magnetic resonance signal. The wireless communication station includes: a receive antenna element configured to wirelessly receive at least one first clock signal among two or more first clock signals which are synchronized with a first clock, a receiver configured to receive the least one first clock signal from the receive antenna element, and in response thereto to output a second clock synchronization signal, a second clock, a phased array antenna comprising a plurality of separately-phased transmit antenna elements separated and spaced apart from each other, wherein two or more of the transmit antenna elements wirelessly transmit two or more corresponding second clock signals which are synchronized with the second clock, and at least two of the transmit antenna elements wirelessly transmit the data representing the sensed magnetic resonance signal, and a clock synchronization circuit configured to receive the second clock synchronization signal and in response thereto to synchronize the second clock to the at least one first clock signal.

BRIEF DESCRIPTION OF THE DRAWINGS

The present invention will be more readily understood from the detailed description of exemplary embodiments presented below considered in conjunction with the accompanying drawings.

DETAILED DESCRIPTION

The present invention will now be described more fully hereinafter with reference to the accompanying drawings, in which embodiments of the present invention are shown. The present invention may, however, be embodied in different forms and should not be construed as limited to the embodiments set forth herein. Rather, these embodiments are provided as teaching examples of the invention.

Figure 1:
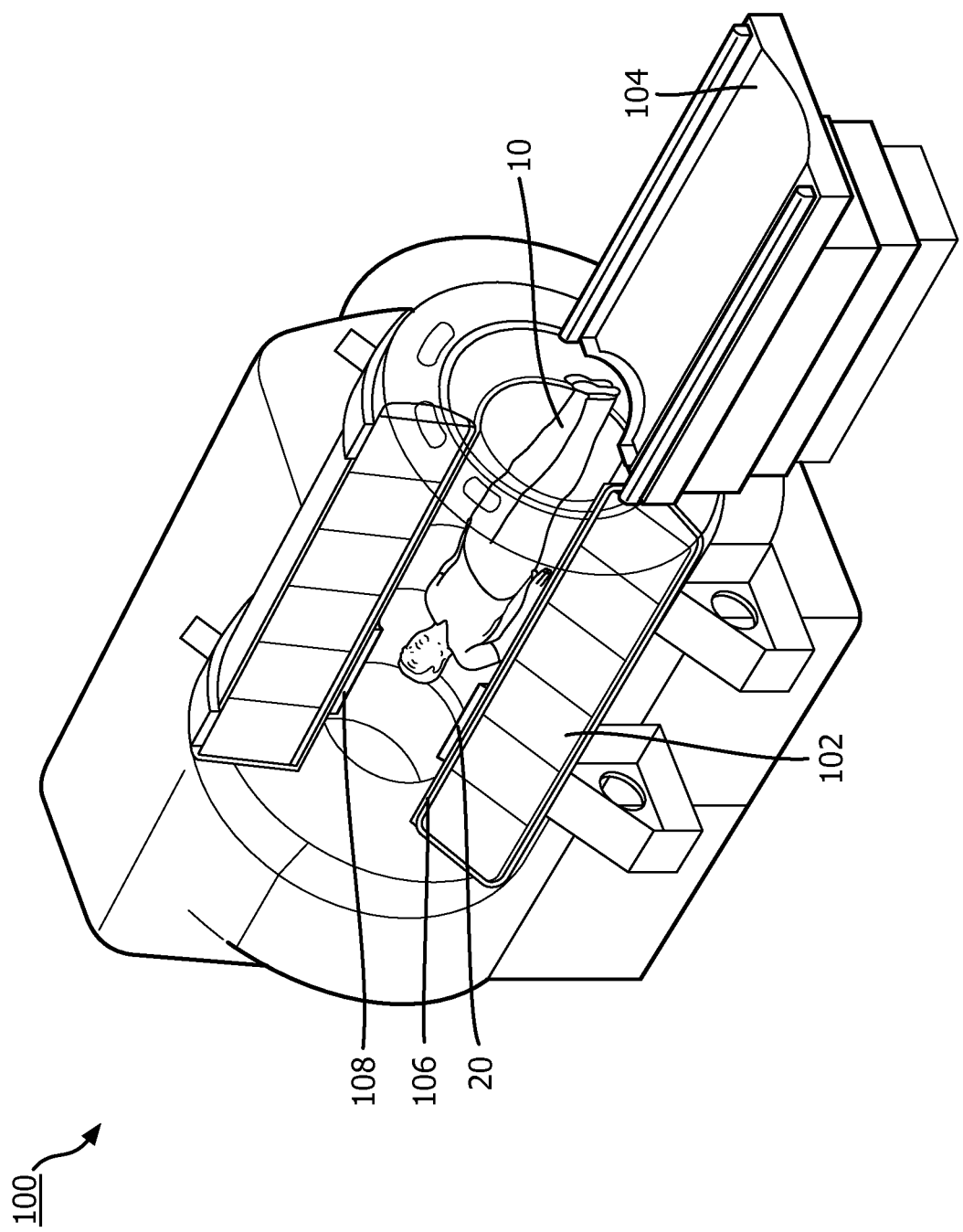
FIG. 1 illustrates an exemplary embodiment of a magnetic resonance imaging (MRI) system.

FIG. 1 illustrates an exemplary embodiment of a magnetic resonance imaging (MRI) system 100. MRI system 100 includes a magnet system 102; a patient table 104 configured to hold a patient 10; gradient coils 106 configured to at least partially surround at least a portion of patient 10 for which MRI system 100 generates an image; and a radio frequency coil 108 configured to apply a radio frequency signal to at least the portion of patient 10 which is being imaged, and to alter the alignment of the magnetic field; and a sensor 20 configured to detect changes in the magnetic field caused by the radio frequency signal and patient 10. In embodiments disclosed herein, sensor 20 may comprise an RF coil unit associated with a corresponding wireless RF station, as will be described in greater detail below.

The general operation of an MRI system is well known and therefore will not be repeated here.

Figure 2:
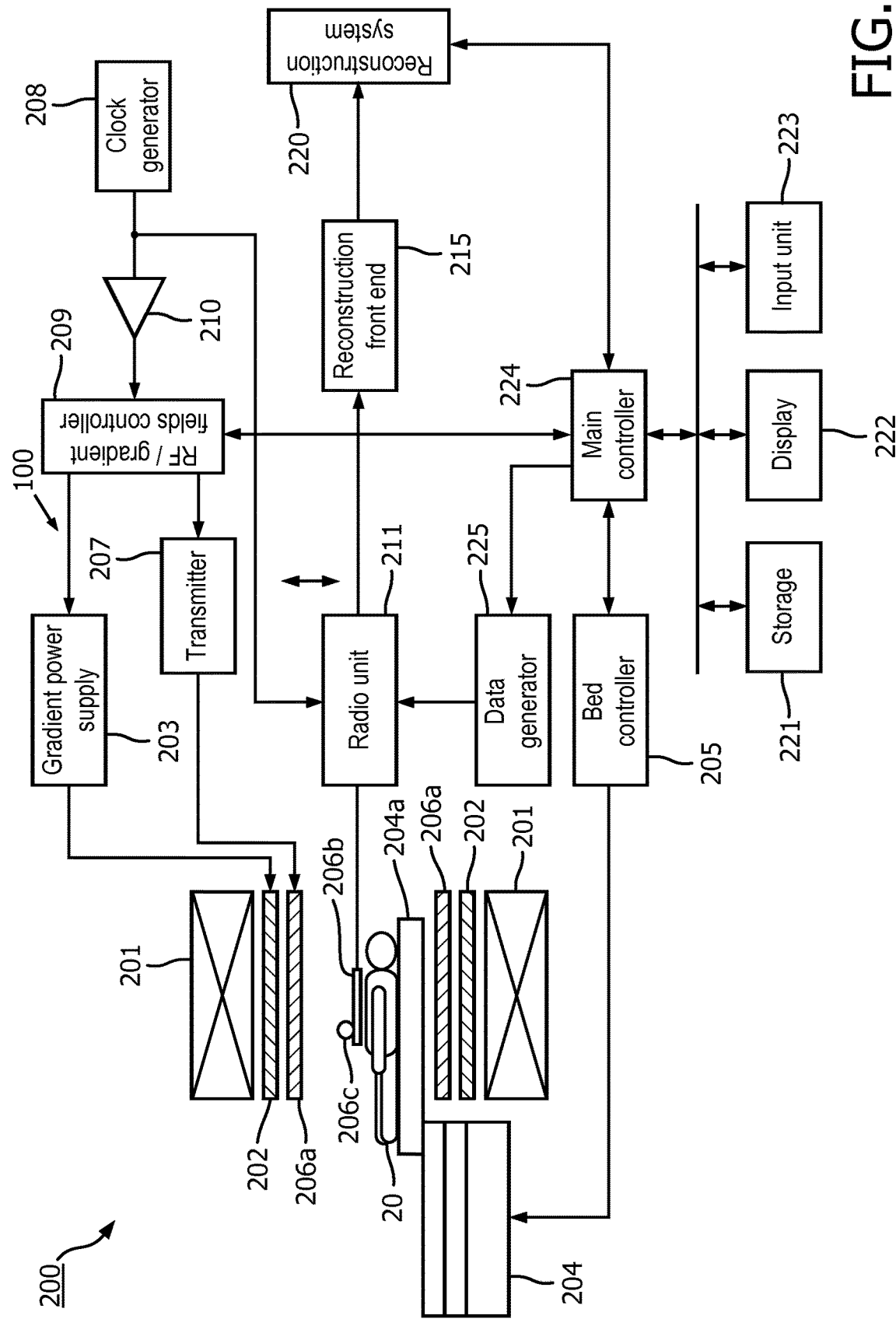
FIG. 2 is a block diagram of an exemplary embodiment of an MRI system employing wireless communication.

FIG. 2 is a block diagram of an exemplary embodiment of an MRI system 200 employing wireless communication.

MRI system 200 includes a static field magnet 201, a gradient magnetic field coil 202, a gradient power supply 203, a patient table or bed 204, a patient table controller 205, RF coil unit 206a, wireless RF station 206b, a transmitter 207, a clock generator 208, an RF/gradient fields controller 209, a driver 210, a radio unit 211, a reconstruction front end 215, a reconstruction system 220, a storage 221, a display 222, an input unit 223, a main controller 224 and a data generator 225.

In some embodiments, the components other than wireless RF station 206b are included in a main unit separate from wireless RF station 206b. Moreover, the main unit may be divided into a gantry and a processing system. In this case, for example, static field magnet 201, gradient magnetic field coil 202, gradient power supply 203, patient table 204, patient table controller 205, RF coil unit 206a, transmitter 207, RF/gradient fields controller 209 and radio unit 211 may be provided in the gantry, while clock generator 208, driver 210, reconstruction front end 215, reconstruction system 220, storage 221, display 222, input unit 223 and main controller 224 may be provided in the processing system.

Static field magnet 201 has a hollow cylindrical shape, and generates a uniform static magnetic field in its internal space. For example, a permanent magnet or superconducting magnet is used as static field magnet 201.

Gradient magnetic field coil 202 has a hollow cylindrical shape, and is disposed inside static field magnet 201. Gradient coil magnetic field 202 may include a combination of three kinds of coils corresponding to X, Y, Z axes which are orthogonal to one another. Gradient magnetic field coil 202 generates a gradient magnetic field having its intensity inclined along the X, Y, Z axes when the three kinds of coils are separately supplied with currents from gradient power supply 203. In addition, the Z axis is in the same direction as, for example, the direction of the static magnetic field. The gradient magnetic fields of the X, Y, and Z axes correspond to, for example, a slice selecting gradient magnetic field Gs, a phase encoding gradient magnetic field Ge and a read-out gradient magnetic field Gr, respectively. The slice selecting gradient magnetic field Gs is used to determine a given imaging section. The phase encoding gradient magnetic field Ge is used to change the phase of a magnetic resonance signal in accordance with a spatial position. The read-out gradient magnetic field Gr is used to change the frequency of the magnetic resonance signal in accordance with the spatial position.

A subject 20 is inserted into an internal space (imaging space) of gradient magnetic field coil 202 while being mounted on a top board 204a of patient table 204. Patient table 204 moves top board 204a in its longitudinal direction (right-and-left direction in FIG. 2) and vertical direction under the control of patient table controller 205. Normally, patient table 204 is installed so that this longitudinal direction is parallel with the central axis of static field magnet 201.

RF coil unit 206a includes one or more coils contained in a cylindrical case. RF coil unit 206a may be disposed inside gradient magnetic field coil 202. RF coil unit 206a is supplied with a high-frequency pulse (RF pulse) from transmitter 207 to generate a high-frequency magnetic field.

Wireless RF station 206b may be mounted on top board 204a, embedded in top board 204a, or attached to subject 20. At the time of imaging, wireless RF station 206b is inserted into the imaging space together with subject 20, and receives or senses the magnetic resonance signal emitted from subject 20 as electromagnetic waves and in response thereto produces digital data representing the sensed magnetic resonance signal. Wireless RF station 206b may include or be attached to one, two, or more receive RF coil units which may include any kind of coils and/or other elements to function as a sensor 206c for sensing the magnetic resonance signal emitted from subject 20. Wireless RF station 206b includes a function of wirelessly transmitting as an electric signal, for example as a digital signal, the digital data representing the magnetic resonance signal sensed or received from subject 20. Wireless RF station 206b also includes a clock to be synchronized with a system clock (see below) of MRI system 200, and which generates a first clock signal, as discussed below.

Transmitter 207 supplies RF coil unit 206a with the RF pulse corresponding to a Larmor frequency.

Clock generator 208 (also referred to herein as a main clock or first clock) generates a first clock signal having a predetermined frequency. Clock generator 208 may be used as a system clock serving as a reference for the timing of the overall operation of MRI system 200.

RF/gradient fields controller 209 changes the gradient magnetic fields in accordance with a required pulse sequence under the control of main controller 224, and controls gradient power supply 203 and transmitter 207 so that the RF pulse may be transmitted. In addition, RF/gradient field controller 209 is provided with the first clock signal after the level of this signal has been properly adjusted by driver 210. RF/gradient fields controller 209 carries out the pulse sequence synchronously with this first clock signal.

Radio unit 211 receives the magnetic resonance signal digitally processed and wirelessly transmitted from wireless RF station 206b. Radio unit 211 digitally demodulates the received magnetic resonance signal to be processed digitally, and then outputs the demodulated signal to reconstruction front end 215. Radio unit 211 also wirelessly transmits data together with a first clock signal to wireless RF station 206b.

Reconstruction front end 215 subjects the magnetic resonance signal provided from radio unit 211 to gain control, frequency conversion and quadrature detection. Reconstruction front end 215 further decompresses the amplitude of the magnetic resonance signal compressed in wireless RF station 206b.

Reconstruction system 220 reconstructs an image of subject 20 on the basis of at least one of the magnetic resonance signals processed in reconstruction front end 215.

Storage 221 stores various kinds of data such as image data indicating the image reconstructed in reconstruction system 220.

Display 222 displays the image reconstructed in the reconstruction system 220 or various kinds of information including various kinds of operation screens for a user to operate MRI system 200, under the control of main controller 224. Any convenient display device, such as a liquid crystal display, can be used as display 22.

Input unit 223 accepts various commands and information inputs from an operator of MRI system 200. Input unit 223 may include a pointing device such as a mouse or a track ball, a selecting device such as a mode changeover switch, and/or an input device such as a keyboard.

Main controller 224 has a CPU, a memory, etc. that are not shown, and controls the whole MRI system 200.

Data generator 225 generates a data signal for communication with wireless RF station 206b via radio unit 211, under the control of main controller 224.

The general operation of an MRI system is well known and therefore will not be repeated here.

In the discussion to follow, reference is made to a first communication station, and in particular a first wireless communication station, and a second communication station. In some embodiments, the first wireless communication station may be considered to be a base station, and the second wireless communication station may be considered to be a mobile station. In some embodiments, portions of the main unit of MRI system 200—including for example radio unit 211, clock generator 208, driver 210, and optionally main controller 224—may correspond to the first wireless communication station described below, and wireless RF station 206b may correspond to the second wireless communication station.

Wireless RF station 206b relies upon an internal ("second") clock for correct synchronization with the main or system ("first") clock of the MRI system 200. However, because of the wireless nature of the communication link and induced RF noise, it is often difficult to accurately synchronize the second clock of wireless RF station 206b with the system clock using conventional wireless communication methods keeping low phase jitter and avoiding phase slips.

Accordingly, as explained in greater detail below, wireless RF station 206b may communicate with the rest of MRI system 200 (e.g., via radio unit 211) with wireless beamforming via a phased array of multiple transmit antennas at each side of the communication link, transmitting clock signals and data over two or more of the antennas to achieve diversity transmission.

With the introduction of such wireless beamforming for phase and data diversity the benefits may be, at least, twofold. First, the phase accuracy may improve, since redundancy is added. Second, data reliability may improve since the same information can be transferred for one or several antennas adding redundancy for error correction.

Figure 3:
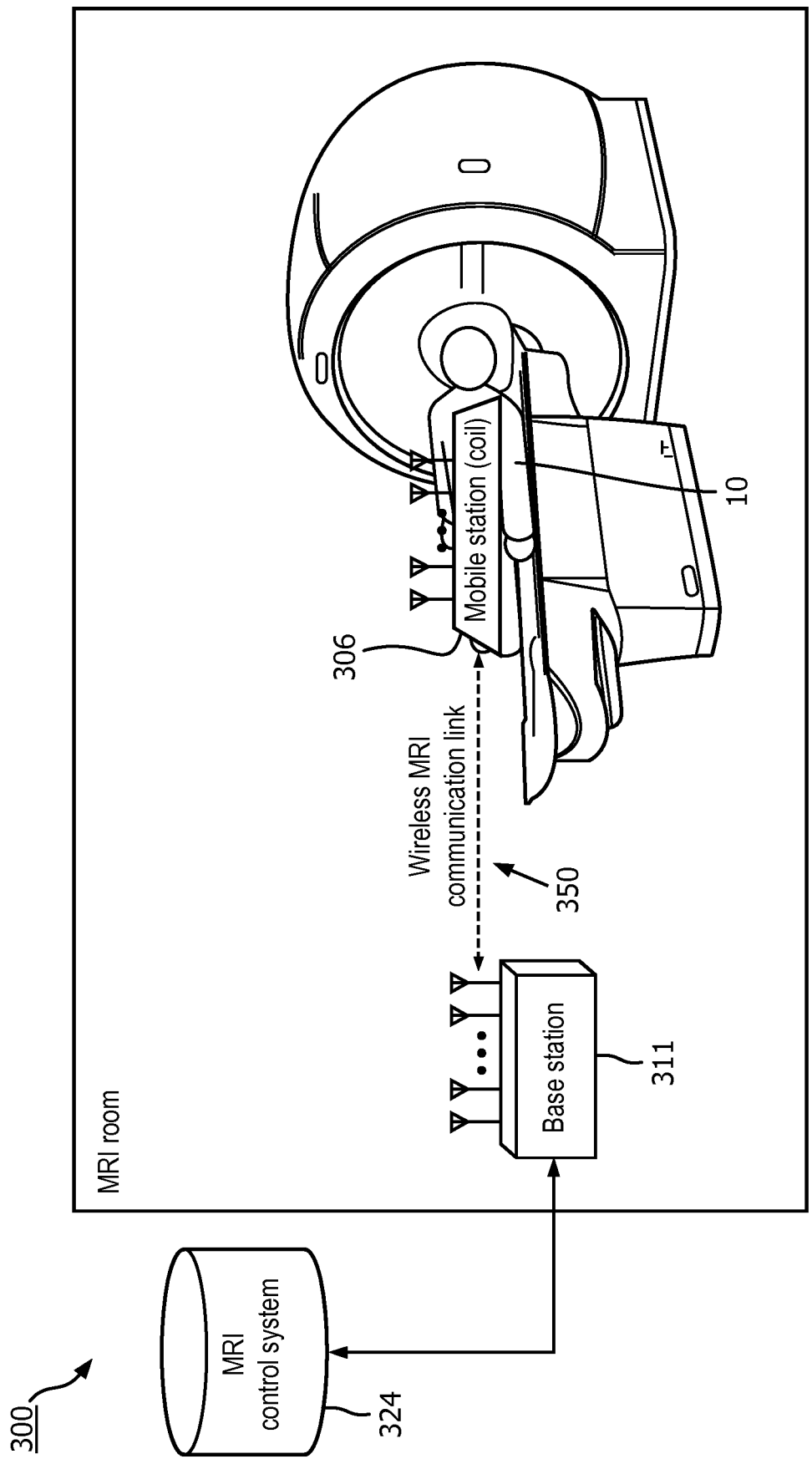
FIG. 3 is a conceptual illustration of an exemplary embodiment of an MRI system employing wireless beamforming and antenna diversity.

FIG. 3 is a conceptual illustration of an exemplary embodiment of an MRI system 300 employing wireless beamforming and antenna diversity. MRI system 300 includes, among other things, a first wireless communication station 311 and a second wireless communication station 306 which communicate wirelessly with each other over a wireless MRI communication link 350. First wireless communication station 311 communicates with an MRI control system 324. MRI system 300 includes other components, such as a magnet system, gradient coils, patient bed, etc. which are not labeled or specifically shown in FIG. 3. MRI system 300 may be one embodiment of MRI system 100 and/or MRI system 200.

First wireless communication station 311 may be one embodiment of the base communication station of MRI system 200, including for example radio unit 211, clock generator 208, driver 210, and second wireless communication station 306 may be one embodiment of wireless RF station 206b of FIG. 2.

As shown in FIG. 3, and described in greater detail below with respect to embodiments shown in FIGS. 4-6, first wireless communication station 311 includes a first phased array antenna comprising a plurality of separately-phased first transmit antenna elements separated and spaced apart from each other, and at least one first receive antenna element. Similarly, second wireless communication station 306 includes a second phased array antenna comprising a plurality of separately-phased second transmit antenna elements separated and spaced apart from each other, and at least one second receive antenna element.

Figure 4:
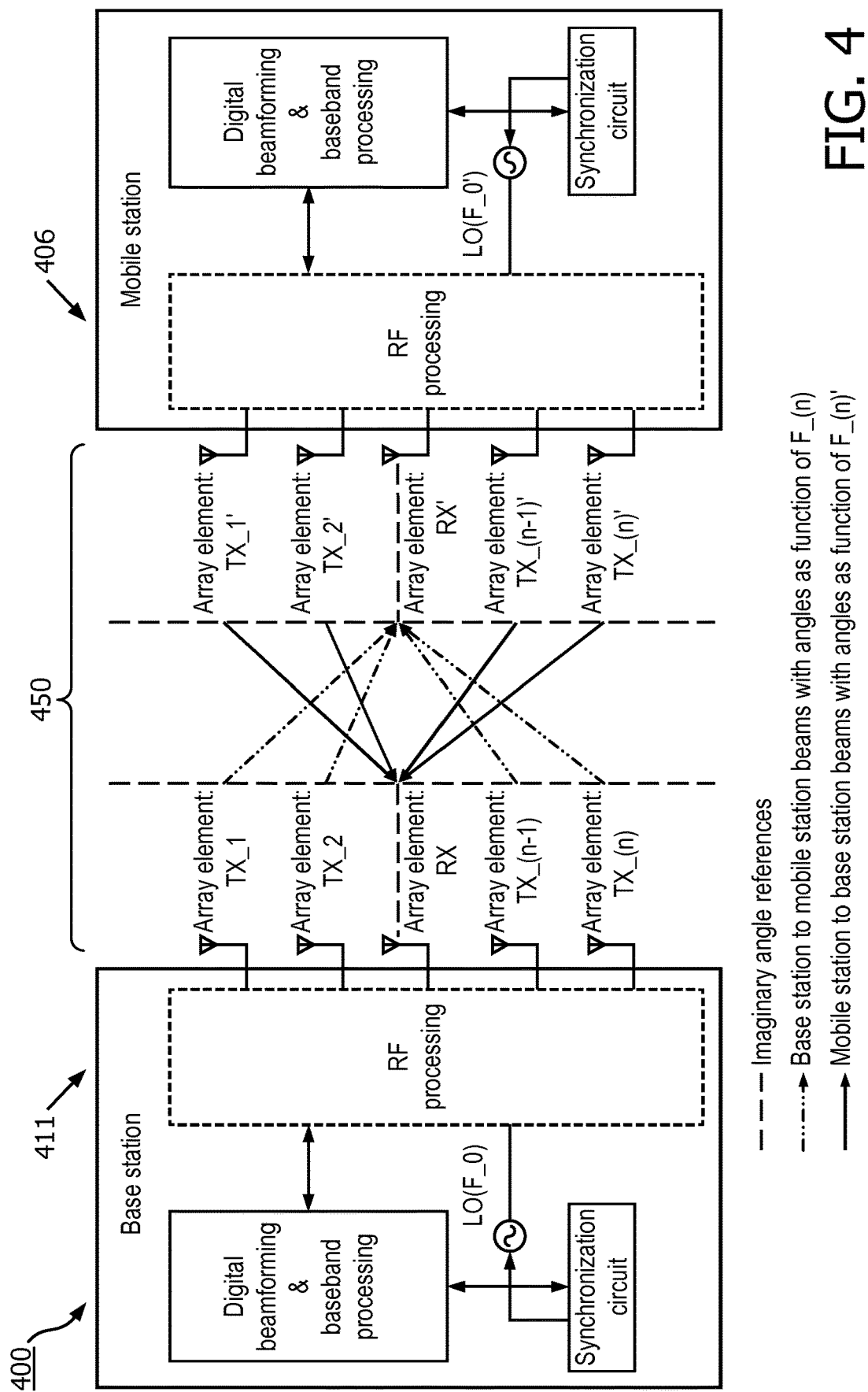
FIG. 4 is a functional block diagram of a wireless communication system which employs beamforming and antenna diversity and which may be used in an MRI system.

FIG. 4 is a functional block diagram of a wireless communication system 400 which employs beamforming and antenna diversity and which may be used in an MRI system, such as MRI systems 100, 200 and/or 300.

Wireless communication system 400 includes a first wireless communication station 411 and a second wireless communication station 406 which communicate wirelessly with each other over a wireless MRI communication link 450.

First wireless communication station 411 may be one embodiment of first wireless communication station 311 of FIG. 3 and/or the base communication station of MRI system 200, including for example radio unit 211, clock generator 208, driver 210, etc., and second wireless communication station 406 may be one embodiment of second wireless communication station 306 of FIG. 3 and/or wireless RF station 206b of FIG. 2.

As shown in FIG. 4, and described in greater detail below with respect to embodiments shown in FIGS. 5 and 6, first wireless communication station 411 includes: a first clock, a first phased array antenna comprising a plurality of separately-phased first transmit antenna elements separated and spaced apart from each other, at least one first receive antenna element, a first RF processor, a first digital beamformer and baseband processor, and a first clock synchronization circuit. Second wireless communication station 406 includes: a second clock, a second phased array antenna comprising a plurality of separately-phased first transmit antenna elements separated and spaced apart from each other, at least one second receive antenna element, a second RF processor, a second digital beamformer and baseband processor, and a second clock synchronization circuit.

Figure 5:
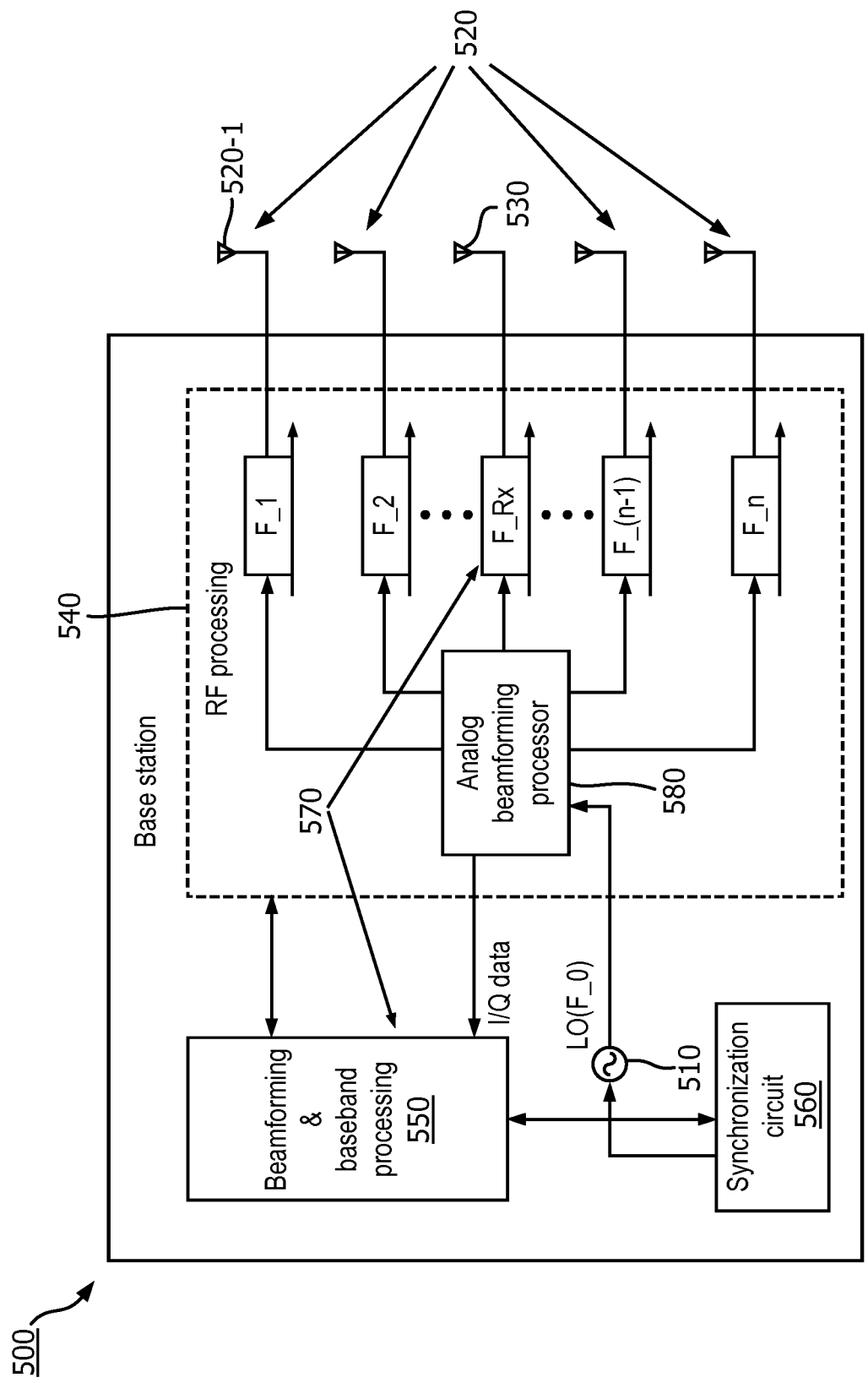
FIG. 5 shows a functional block diagram of a base communication station which employs beamforming and antenna diversity and which may be used in an MRI system.

FIG. 5 shows in more detail a functional block diagram of a base communication station 500 which employs beamforming and antenna diversity and which may be used in an MRI system, such as MRI systems 100, 200 and/or 300. Base communication station 500 may be one embodiment of first wireless communication station 411 of FIG. 4.

Base communication station 500 includes a first clock 510, a first phased array antenna 520 comprising a plurality of separately-phased first transmit antenna elements 520-1 separated and spaced apart from each other, at least one first receive antenna element 530, an RF processor 540, a digital beamformer and baseband processor 550, and a first clock synchronization circuit 560. Portions of RF processor 540 and digital beamformer and baseband processor 550 comprise a first receiver 570. RF processor 540 includes an analog beamforming processor 580, which process the arriving signals at first receive antenna element 530 to take advantage of phase and signal diversity to discipline first clock 510 and transmit with first transmit antenna elements 520-1 synchronously.

Figure 6:
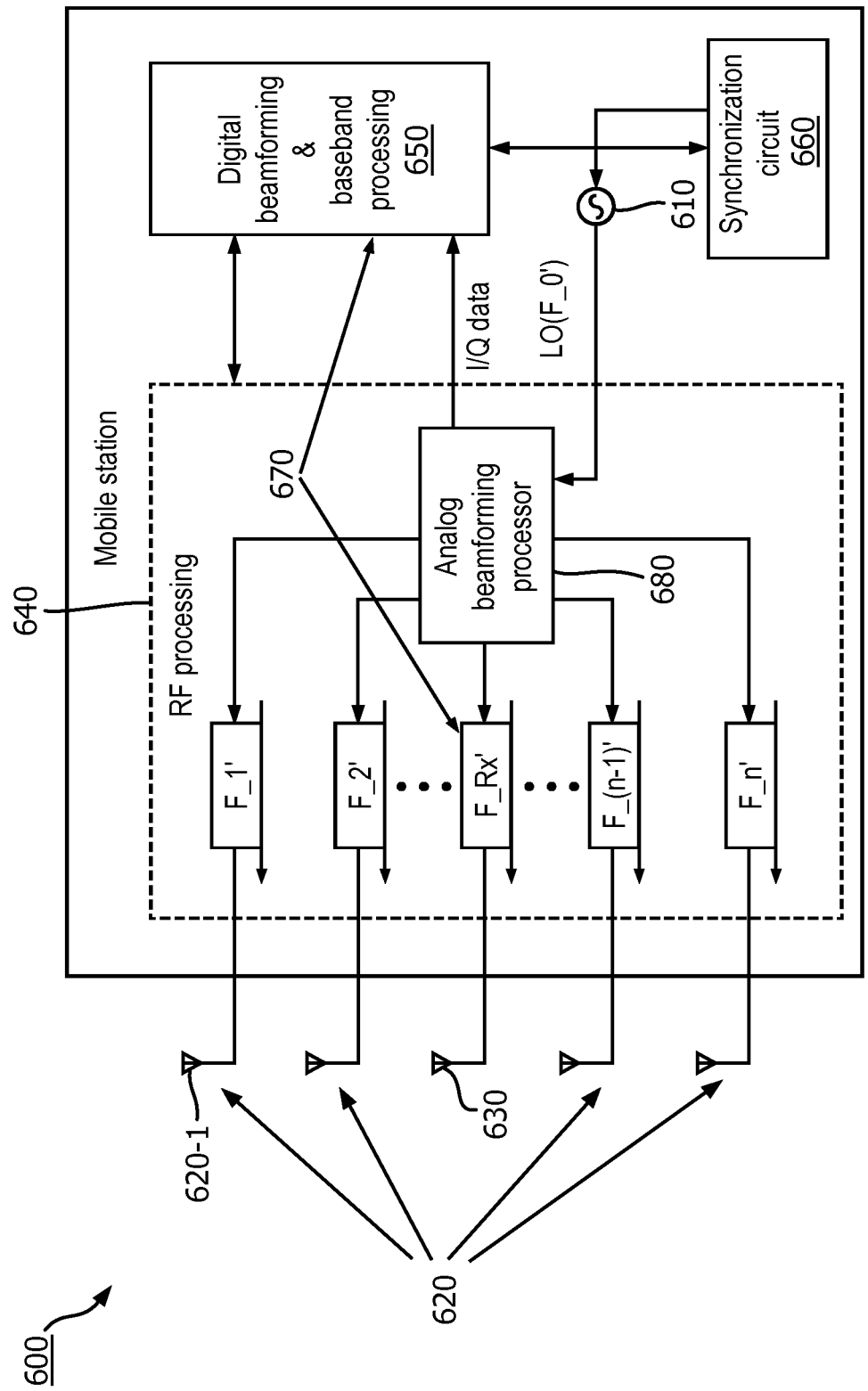
FIG. 6 shows a functional block diagram of a mobile communication station which employs beamforming and antenna diversity and which may be used in an MRI system.

FIG. 6 shows a functional block diagram of a mobile communication station 600 which employs beamforming and antenna diversity and which may be used in an MRI system. Mobile communication station 600 may be one embodiment of second wireless communication station 406 of FIG. 4.

Mobile communication station 600 includes a second clock 610, a second phased array antenna 620 comprising a plurality of separately-phased second transmit antenna elements 620-1 separated and spaced apart from each other, a second receive antenna element 630, an RF processor 640, a digital beamformer and baseband processor 650, and a second clock synchronization circuit 660. Portions of RF processor 640 and digital beamformer and baseband processor 650 comprise a second receiver 670. RF processor 640 includes an analog beamforming processor 680, which may process the arriving signals at second receive antenna element 630 to take advantage of phase and signal diversity to discipline second clock 610 and transmit with second transmit antenna elements 620-1 synchronously.

The main components of the wireless beamforming for the MRI wireless link are shown in FIGS. 4-6. The goal is to keep the wireless communication link operational for clock synchronization and data transmission within the required parameters for the MRI system. Since the clock synchronization is performed wirelessly (over the air), phase tracking is required to correct the local oscillator (LO) at each end. The phase diversity information is generated via the beamforming and baseband processing using pre-coding techniques. Data and clock are sent via multiple antennas (i.e., via transmit antenna array 520/620). In particular, data and clock can be distributed such that at least two antenna elements 520-1/620-1 are used for clock synchronization and two antenna elements 520-1/620-1 for data at each wireless communication station (to achieve diversity). One or more receive antenna elements 530/630 at each wireless communication station may be used at least to collect the sum of the transmitted beams with the diversity information. On this realization, each transmit array antenna element 520-1/620-1 transmits at a different phase which is established by the analog beamformer processor 580, and which in turn is synchronized via a clock synchronization circuit (e.g., a clock synchronization circuit 560) with the collected clock phase information from the received clock signals of the various transmit antennas of the other wireless communication station 406/411.

Via wireless MRI communication link 450, several sources of information arrive at the receive antenna element 530/630 with angle of arrival depending on F(n) and F(n)' respectively which are dependent on the carrier phase. At each receive antenna element 530/630 the signal diversity contributes to more accurate clock synchronization and data signal-to-noise ration (SNR). Under this scenario, if a signal transmitted by one antenna element 520-1/620-1 of one wireless communication station 406/411 is blocked from reaching receive antenna element 530/630 of the other wireless communication station 411/406 by patient 10 or by patient movement (LOS loss), the redundancy can compensate to minimize any phase slip on the carrier tracking.

The recovered signal in baseband from n_t transmit antenna elements 520-1/620-1 at receiver antenna element (k) for symbol m is defined as:

$$y_k[m] = \left( \sum_{l=1}^{n_t} \sqrt{\alpha_l[m]} \, e^{j\varphi_l[m]} h_{lk}[m] \right) x[m] + w_k[m] \quad (1)$$

where $\alpha_l[m]$ represents the allocated power for the symbol m and $\varphi_l[m]$ represents the phase shifts applied, the overall channel gain is defined by:

$$\left( \sum_{l=1}^{n_t} \sqrt{\alpha_l[m]} \, e^{j\varphi_l[m]} h_{lk}[m] \right) \quad (2)$$

Here we assume the channel components are known at the receiver of each wireless communication station, i.e., flat fading assumption will remove the need of the channel information state.

An exemplary operation of an MRI system (e.g., MRI system 100, MRI system 200 and/or MRI system 300) which includes wireless communication system 400, including first wireless communication station 411, which may have the architecture of base communication station 500 of FIG. 5, and second wireless communication station 406, which may have the architecture of mobile communication station 600 of FIG. 6, will now be described.

A magnet system of the MRI system (e.g., static field magnet 201 of FIG. 2) produces a magnetic field while a patient table (e.g., patient table 204 of FIG. 2) holds a patient 10. One or more gradient magnetic field coils (e.g., gradient magnetic field coil 202 of FIG. 2) at least partially surround at least a portion of patient 10, and a radio frequency (RF) coil unit (e.g., RF coil unit 206a of FIG. 2) applies an RF signal to at least a portion of patient 10 which is being imaged, and alters an alignment of the magnetic field in the portion of patient 10. A sensor 206c senses a magnetic resonance signal emitted from patient 10 in response to the RF signal. A second wireless communication station (e.g., second wireless communication station 206b/306/406/600) wirelessly transmits data representing the sensed magnetic resonance signal, and a first wireless communication station (e.g., first wireless communication station 311/411/500) separated and spaced apart from second wireless communication station 206b/306/406/600, wirelessly receives from second wireless communication station 206b/306/406/600 data representing the sensed magnetic resonance signal.

First wireless communication station 311/411/500 includes: a first clock 510, a first phased array antenna 520 comprising a plurality of separately-phased first transmit antenna elements 520-1 separated and spaced apart from each other, wherein two or more of the first transmit antenna elements 520-1 transmit two or more corresponding first clock signals which are synchronized with first clock 510, at least one first receive antenna element 530 configured to receive at least one second clock signal among two or more second clock signals which are synchronized with a second clock and transmitted from second wireless communication station 311/411/500, a first receiver 570 (e.g., comprising portions of RF processor 540 and digital beamformer and baseband processor 550) configured to receive the least one second clock signal from first receive antenna element 530, and in response thereto to output a first clock synchronization signal, and a first clock synchronization circuit 560 configured to receive the first clock synchronization signal and in response thereto to synchronize first clock 510 to the at least one second clock signal.

Second wireless communication station 311/411/600 includes: the second clock 610; a second phased antenna array 620 comprising a plurality of separately-phased second transmit antenna elements 620-1 separated and spaced apart from each other, wherein two or more of the second transmit antenna elements 620-1 transmit the two or more second clock signals which are synchronized with the second clock, and at least two of the second transmit antenna elements 620-1 transmit the data representing the sensed magnetic resonance signal, at least one second receive antenna element 630 configured to receive at least one first clock signal among the two or more first clock signals from at least one of the two or more first transmit antenna elements 520-1 which transmit the first clock signals, a second receiver 670 (e.g., comprising portions of RF processor 540 and digital beamformer and baseband processor 650) configured to receive the at least one first clock signal from second receive antenna element 630 and in response thereto to output a second clock synchronization signal, and a second clock synchronization circuit 660 configured to receive the second clock synchronization signal and in response thereto to synchronize second clock 610 to the at least one first clock signal.

Here, because two or more second clock signals which are synchronized with second clock 610 are transmitted by second wireless communication station 306/406/600 from two or more second transmit antenna elements 620-1 of second phased antenna array 620, if the line-of-site to first receive antenna element 530 from one of the second transmit antenna elements 620-1 is blocked, at least one second clock signal may still reach first receive antenna element 530 from another second transmit antenna element 620-1 whose path is not blocked. Similarly, because two or more first clock signals which are synchronized with first clock 510 are transmitted by first wireless communication station 311/411/500 from two or more first transmit antenna elements 520-1 of first phased antenna array 520, if the line-of-site to second receive antenna element 630 from one of the first transmit antenna elements 520-1 is blocked, at least one first clock signal may still reach second receive antenna element 630 from another first transmit antenna element 520-1 whose path is not blocked. Thereby, clock synchronization may be maintained.

Also, data redundancy may be provided by second wireless communication station 306/406/600 transmitting the data representing the sensed magnetic resonance signal from two or more second transmit antenna elements 620-1 of second phased antenna array 620 to first receive antenna element 530. Similar data redundancy may be provided for any data which is transmitted from first wireless communication station 311/411/500 to second wireless communication station 306/406/600.

In most cases, depending on how much, if any, of the line-of-site communication path is blocked, it is expected that second receive antenna element(s) 630 will receive at least two first clock signals from two or more first transmit antenna elements 520-1 which transmit the two or more first clock signals. In that case, second receiver 670 outputs the second clock synchronization signal in response to the at least two first clock signals received from the two or more first transmit antenna elements 520-1 which transmit the first clock signal. Also in most cases, it is expected that first receive antenna element(s) 530 will receive at least two second clock signals from two or more second transmit antenna elements 620-1 which transmit the two or more second clock signals. In that case, second receiver 670 outputs the first clock synchronization signal in response to the at least two second clock signals received from the two or more second transmit antenna elements 620-1 which transmit the second clock signal.

Beneficially, the two or more first transmit antenna elements 520-1 which transmit the two or more first clock signals which are synchronized with first clock 510 transmit with different phases from each other. Also beneficially, the at least two of the first transmit antenna elements which transmit the data representing the sensed magnetic resonance signal transmit signals which have different phases from each other.

In some embodiments, the second receiver is further configured to receive the data representing the sensed magnetic resonance signal.

In some example embodiments, the MRI system may include a clock divider (e.g., included within analog beamformer processor 580 of RF processor 540) which is configured to receive an output from first clock 510 and in response thereto to provide the two or more first clock signals, which are synchronized with first clock 510, and two or more different phases than each other, which may be transmitted by a corresponding number of different first transmit antenna elements 520-1.

Figure 7:
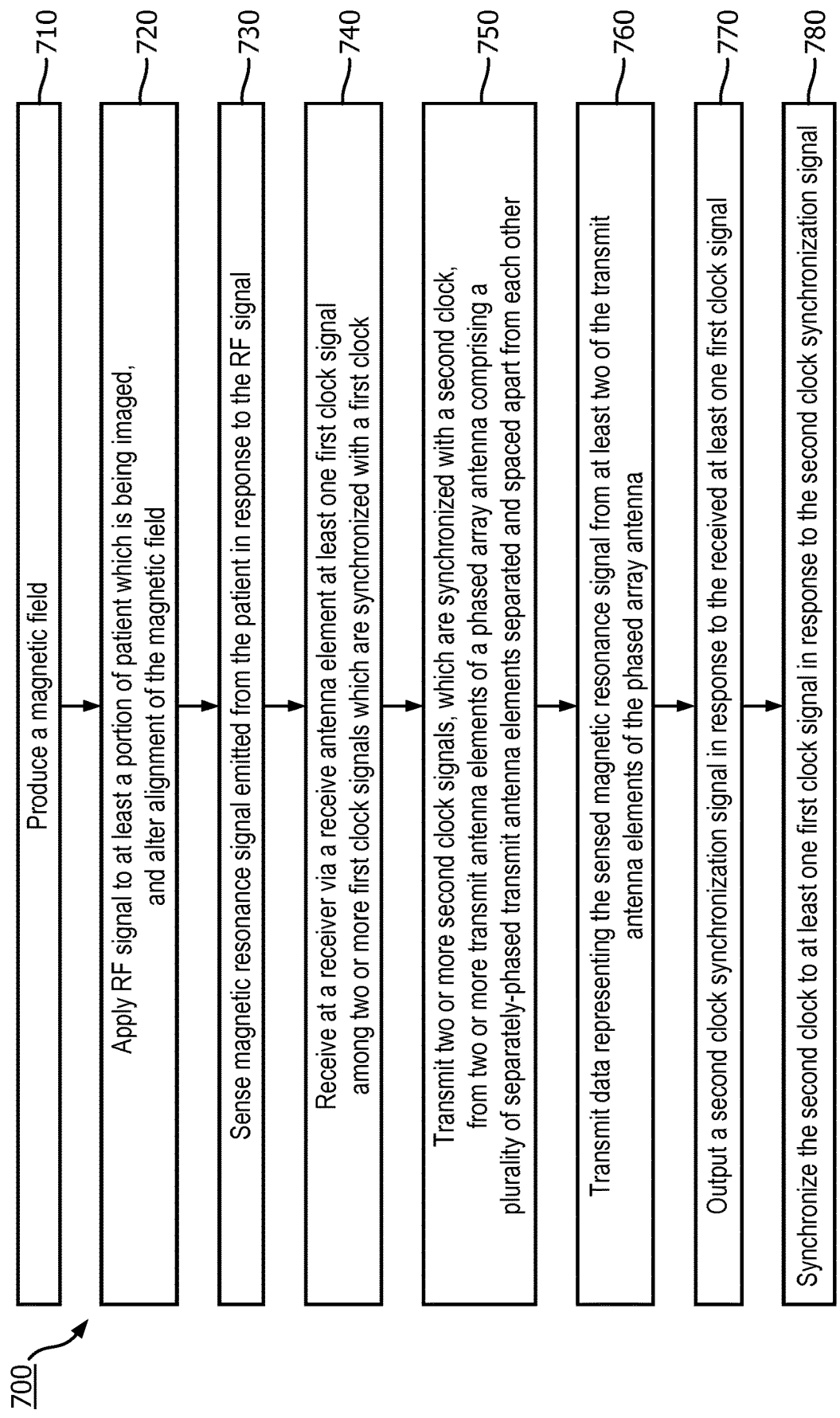
FIG. 7 illustrates an example embodiment of a method of operation an MRI system which includes a wireless communication system which employs beamforming and antenna diversity.

FIG. 7 illustrates an example embodiment of a method 700 of operating an MRI system, such as MRI systems 100, 200 and/or 300, which includes a wireless communication system, such as wireless communication system 400, which employs beamforming and antenna diversity.

An operation 710 includes producing a magnetic field.

An operation 720 includes applying an RF signal to at least a portion of the patient which is being imaged, and altering an alignment of the magnetic field.

An operation 730 includes sensing a magnetic resonance signal emitted from the patient in response to the RF signal.

An operation 740 includes receiving at a receiver via a receive antenna element at least one first clock signal among two or more first clock signals which are synchronized with a first clock.

An operation 750 includes wirelessly transmitting two or more second clock signals, which are synchronized with a second clock, from two or more corresponding transmit antenna elements of a phased array antenna comprising a plurality of separately-phased first transmit antenna elements separated and spaced apart from each other.

An operation 760 includes wirelessly transmitting data representing the sensed magnetic resonance signal from at least two of the transmit antenna elements of the phased array antenna.

An operation 770 includes outputting a second clock synchronization signal in response to the received at least one first clock signal.

An operation 770 includes synchronizing the second clock to the at least one first clock signal in response to the second clock synchronization signal.

It should be understood that the order in which the operations are listed in FIG. 7 is merely an order for describing the operations and is not meant to indicate that the operations are necessarily performed in that order. Many of the operations in fact may be performed at the same time as each other. For example operations 740 and/or 750 may be performed in parallel with operations 710-730, etc. Indeed it should be understood that, in general, these operations may be continuously performed in a method of gathering magnetic resonance data at a mobile communication station and wirelessly transmitting the data to a base communication station of an MRI system while maintaining clock synchronization between the stations through the use of phase and signal diversity with multiple transmit antennas at each station.

MRI systems are required to maintain an ecosystem that can coexist in a medical facility that is stable and well controlled to function properly and not interfere with other electromagnetic devices. This is due to the highly sensitive nature of the weak patient signal and strong MRI transmitter. These requirements create the need for MRI systems to be located within a restricted and confined RF shielded room. The MRI location and ecosystem necessitates specific and unusual conditions for wireless communication. A wireless communication protocol should maintain a high level service of quality within an environment with unpredictable MRI conditions that consist of high power spurious emissions, dense multipath channel condition with large variation of signal propagation over position, frequency and time without impacting the MRI signal or signal-to-noise ratio (SNR).

To address one or more of these issues, in some embodiments of MRI machines and wireless communication systems as described above, the first wireless communication station and second wireless communication station may communicate with each other according to a communication protocol which is compliant with a standard for ultra-wideband (UWB) communications in which a short pulse (e.g., less than a few nanoseconds) phase shift keying (PSK) modulated signal is spread over a wide spectrum. This short pulse UWB technology may also be referred to as direct sequence UWB (DS-UWB) or impulse radio UWB (IR-UWB). Unlike traditional narrowband technology (Bluetooth, WiFi, etc) or orthogonal frequency-division multiplexing UWB (OFDM-UWB) which are greatly affected by signal propagation conditions, pulse UWB thrives in multipath environments such as might be found in the MRI room. Here it is understood that UWB means a transmission with a bandwidth of greater than 500 MHz for a given power emission mask, which for short pulse PSK UWB means that the energy per bit (Eb) has a spread factor equal to the channel bandwidth greater than 500 MHz. Because the Eb is spread over the entire UWB channel, there is a zero mean fading. The short pulse also benefits from the timing of the reflected path delay being greater than the transmission period. The probability density function for short pulse UWB channels can be greater than free-space performance in a multipath environment. The spread factor and emission limits also mean that short pulse UWB has a low probability to interference and interception, which is required to coexist in an environment where strong MRI frequency and harmonic spurs are generated. The UWB standard allows for transmissions in a frequency range from 3.1 GHz to 10.6 GHz, which allows the exact frequencies which are employed to be selected to avoid heavily congested spectrum like the 2.4 GHz and 5.8 GHz.

One of the challenges for clock synchronization in wireless MRI system communication is temporal variations in the propagation delay for the wireless clock synchronization signal. Such temporal variations may be caused by motion of the patient, the patient table, or operating personal inside the MRI room.

In some embodiments, multipath echoes also may be reduced in the received signal by using an UWB signal with a long encoding length as a synch pulse. The encoding signal may be chosen so that it has a strong autocorrelation peak with low side lobes. Examples for such signals are Pseudo-Random-Noise (PRN) Codes, such as Barker Codes, or Gold Codes.

While preferred embodiments are disclosed herein, many variations are possible which remain within the concept and scope of the invention. Such variations would become clear to one of ordinary skill in the art after inspection of the specification, drawings and claims herein. The present invention therefore is not to be restricted except within the scope of the appended claims.

What is claimed is:

1. A method, comprising:
producing a magnetic field;
applying an RF signal to at least a portion of a patient which is being imaged, and altering an alignment of the magnetic field;
sensing a magnetic resonance signal emitted from the patient in response to the RF signal;
receiving at a receiver via a receive antenna element at least one first clock signal among two or more first clock signals which are synchronized with a first clock;
wirelessly transmitting two or more second clock signals, at different phases, which are synchronized with a second clock, from two or more corresponding transmit antenna elements of a phased array antenna comprising a plurality of separately-phased transmit antenna elements separated and spaced apart from each other;
wirelessly transmitting data representing the sensed magnetic resonance signal from at least two of the transmit antenna elements of the phased array antenna;
in response to the at least one first clock signal received at the receiver, outputting a second clock synchronization signal; and
synchronizing the second clock to the at least one first clock signal in response to the second clock synchronization signal.

2. The method of claim 1, further comprising:
wirelessly transmitting the two or more first clock signals from another phased antenna array comprising another plurality of separately-phased transmit antenna elements separated and spaced apart from each other;
receiving at another receiver via another receive antenna element at least one second clock signal among the two or more second clock signals from at least one of the two or more transmit antenna elements which transmit the second clock signals, and in response thereto outputting a first clock synchronization signal; and
synchronizing the first clock to the at least one second clock signal in response to the first clock synchronization signal.

3. The method of claim 2, further comprising the other receiver receiving the data representing the sensed magnetic resonance signal.

4. The method of claim 2, further comprising:
receiving at the other receiver via the other receive antenna element at least two second clock signals among the two or more second clock signals; and
outputting the first clock synchronization signal in response to the at least two second clock signals.

5. The method of claim 1, further comprising:
receiving at the receiver via the receive antenna element at least two first clock signals among the two or more first clock signals; and
outputting the first clock synchronization signal in response to the at least two first clock signals.

6. The method of claim 1, wherein wirelessly transmitting the two or more second clock signals which are synchronized with the second clock comprises wirelessly transmitting the two or more second clock signals with different phases than each other.

7. The method of claim 1, further comprising receiving an output from the first clock and in response thereto to provide the two or more first clock signals, which are synchronized with the first clock, having two or more different phases than each other.

8. A device, comprising:
a sensor configured to sense a magnetic resonance signal emitted from a patient in response to a magnetic field and a radio frequency signal; and
a wireless communication station configured to wirelessly transmit data representing the sensed magnetic resonance signal,
wherein the wireless communication station includes:
a receive antenna element configured to wirelessly receive at least one first clock signal among two or more first clock signals which are synchronized with a first clock,
a receiver configured to receive the least one first clock signal from the receive antenna element, and in response thereto to output a second clock synchronization signal,
a second clock,
a phased array antenna comprising a plurality of separately-phased transmit antenna elements separated and spaced apart from each other and coupled with the RF processor, wherein two or more of the transmit antenna elements wirelessly transmit two or more corresponding second clock signals at different phases which are synchronized with the second clock by the RF processor, and at least two of the transmit antenna elements wirelessly transmit the data representing the sensed magnetic resonance signal, and
a clock synchronization circuit configured to receive the second clock synchronization signal and in response thereto to synchronize the second clock to the at least one first clock signal.

9. The device of claim 8, wherein the receive antenna element is further configured to wirelessly receive the at least two first clock signals among the two or more first clock signals, and the receiver is further configured to output the second clock synchronization signal in response to the at least two first clock signals.

10. The device of claim 8, wherein the two or more transmit antenna elements which wirelessly transmit the corresponding two or more second clock signals which are synchronized with the second clock transmit with different phases than each other.

11. The device of claim 8, wherein the at least two of the transmit antenna elements which wirelessly transmit the data representing the sensed magnetic resonance signal transmit with different phases than each other.

12. The device of claim 8, further comprising a clock divider configured to receive an output from the second clock and in response thereto to provide the two or more first clock signals, which are synchronized with the first clock, with two or more different phases than each other.

13. The device of claim 8, further comprising another wireless communication station, which includes:
   the first clock;
   another phased antenna array comprising another plurality of separately-phased transmit antenna elements separated and spaced apart from each other, wherein two or more of the plurality of other transmit antenna elements wirelessly transmit the two or more first clock signals which are synchronized with the first clock,
   another receive antenna element configured to wirelessly receive at least one second clock signal among the two or more second clock signals from at least one of the two or more transmit antenna elements which transmit the second clock signals,
   another receiver configured to receive the at least one second clock signal from the other receive antenna element and in response thereto to output a first clock synchronization signal, and
   another clock synchronization circuit configured to receive the first clock synchronization signal and in response thereto to synchronize the first clock to the at least one second clock signal.

14. The device of claim 13, wherein the other receiver is further configured to receive the data representing the sensed magnetic resonance signal.

15. The device of claim 7, further comprising an analog beamforming processor configured to receive an output from the first clock and in response thereto to provide the two or more first clock signals, which are synchronized with the first clock, having two or more different phases than each other.

* * * * *